US010236230B2

(12) United States Patent
Yoneda et al.

(10) Patent No.: US 10,236,230 B2
(45) Date of Patent: Mar. 19, 2019

(54) ELECTRONIC DEVICE AND METHOD FOR MANUFACTURING THE SAME

(71) Applicant: DENSO CORPORATION, Kariya, Aichi-pref. (JP)

(72) Inventors: Shuji Yoneda, Kariya (JP); Daisuke Fukuoka, Kariya (JP); Eiji Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/772,116

(22) PCT Filed: Mar. 13, 2017

(86) PCT No.: PCT/JP2017/009857
§ 371 (c)(1),
(2) Date: Apr. 30, 2018

(87) PCT Pub. No.: WO2017/175542
PCT Pub. Date: Oct. 12, 2017

(65) Prior Publication Data
US 2018/0323125 A1 Nov. 8, 2018

(30) Foreign Application Priority Data

Apr. 4, 2016 (JP) .................................. 2016-075388

(51) Int. Cl.
| | |
|---|---|
| H01L 23/31 | (2006.01) |
| H01L 23/00 | (2006.01) |
| H01L 23/495 | (2006.01) |

(52) U.S. Cl.
CPC .... *H01L 23/3107* (2013.01); *H01L 23/49541* (2013.01); *H01L 23/49582* (2013.01);
(Continued)

(58) Field of Classification Search
CPC ........... H01L 23/3107; H01L 23/49541; H01L 23/49582; H01L 24/29; H01L 24/48;
(Continued)

(56) References Cited

U.S. PATENT DOCUMENTS

| | | | |
|---|---|---|---|
| 2002/0149090 | A1 | 10/2002 | Ikenaga et al. |
| 2002/0153596 | A1 | 10/2002 | Tsubosaki et al. |

(Continued)

FOREIGN PATENT DOCUMENTS

| | | |
|---|---|---|
| JP | 2002-280512 A | 9/2002 |
| JP | 2004-281510 A | 10/2004 |

(Continued)

*Primary Examiner* — Peniel M Gumedzoe
(74) *Attorney, Agent, or Firm* — Posz Law Group, PLC

(57) ABSTRACT

In an electronic device, an inner lead of a signal terminal includes a base member, and a film on a surface of the inner lead adjacent to a bonding surface. The film includes a metal thin film disposed on the surface of the base member and having a portion to which a bonding wire is connected, and an oxide film made of an oxide of the same metal as a metal being a main component of the metal thin film, and disposed in at least a part of a region of the metal thin film, excluding a connection region of a bonding wire. The oxide film includes an uneven oxide film having a surface with continuous asperities formed by irradiating the metal thin film with pulsed laser light. The uneven oxide film is disposed in at least a part of a front end region of the bonding surface.

12 Claims, 10 Drawing Sheets

(52) U.S. Cl.
CPC .............. *H01L 24/29* (2013.01); *H01L 24/48* (2013.01); *H01L 2224/33* (2013.01); *H01L 2224/48091* (2013.01); *H01L 2224/48247* (2013.01); *H01L 2924/18301* (2013.01)

(58) Field of Classification Search
CPC ....... H01L 2224/33; H01L 2224/48091; H01L 2224/48247; H01L 2924/18301
See application file for complete search history.

(56) References Cited

U.S. PATENT DOCUMENTS

2003/0075792 A1* 4/2003 Ruhland ............. H01L 23/3107
    257/693
2013/0078423 A1   3/2013 Sutou et al.
2014/0305914 A1  10/2014 Sutou et al.

FOREIGN PATENT DOCUMENTS

JP          4472773 B1   6/2010
JP      2012-064880 A   3/2012

\* cited by examiner

US 10,236,230 B2

ELECTRONIC DEVICE AND METHOD FOR MANUFACTURING THE SAME

CROSS REFERENCE TO RELATED APPLICATIONS

This application is a U.S. national phase of International Application No. PCT/JP2017/009857 filed on Mar. 13, 2017 and is based on and claims priority to Japanese Patent Application No. 2016-75388 filed on Apr. 6, 2016, the contents of which are incorporated herein by reference.

TECHNICAL FIELD

The present disclosure relates to a resin-encapsulated type electronic device and a method for manufacturing the same.

BACKGROUND ART

There is known a resin-encapsulated type electronic device including an electronic component, an encapsulating resin body that encapsulates the electronic component, a lead frame extended over the inside and outside of the encapsulating resin body, and a bonding wire that electrically connects the electronic component and the lead frame inside the encapsulating resin body. The lead frame includes an inner lead disposed inside the encapsulating resin body, and an outer lead connecting to the inner lead and protruding to the outside of the encapsulating resin body.

Patent Literature 1 discloses a resin-encapsulated type electronic device (semiconductor package) including a lead frame that is plated with multiple layers so as to restrict an encapsulating resin body from being peeled off from the lead frame and a bonding wire from being disconnected due to the peeling. In Patent Literature 1, the entire surface of the lead frame is subjected to Cu strike plating, then an outer lead is masked with a jig, and an inner lead is subjected to roughening Cu plating. Next, the front end of the inner lead is opened and subjected to Ag plating by using a jig masking the other portion.

PRIOR ART LITERATURE

Patent Literature

Patent Literature 1: JP 2002-299538 A

SUMMARY OF INVENTION

According to the conventional technique disclosed in Patent Literature 1, it is possible to restrict the encapsulating resin body from being peeled off from the lead frame by an anchoring effect of the roughening Cu plating with the uneven surface. That is, it is possible to restrict the peeling of the encapsulating resin body from reaching a connection region of the bonding wire and to restrict disconnection of the bonding wire.

Further, the connection region of the bonding wire in the roughening plating is subjected to Ag plating so as to be made substantially flat, so that the bonding wire can be connected.

However, according to the conventional technique, it is necessary to perform plating at least in three stages. This complicates the configuration of the lead frame, eventually the electronic device. In addition, it is necessary to form a mask for local plating and to remove the mask after plating. This complicates the manufacturing process.

An object of the present disclosure is to provide an electronic device and a method for manufacturing the same, which are capable of simplifying the configuration and manufacturing process while restricting disconnection of a bonding wire due to peeling of an encapsulating resin body.

According to a first aspect of the present disclosure, an electronic device includes: an electronic component; an encapsulating resin body that encapsulates the electronic component; a lead frame that includes an inner lead disposed inside the encapsulating resin body, and an outer lead connecting to the inner lead and protruding to an outside of the encapsulating resin body, and extends over an inside and outside of the encapsulating resin body; and a bonding wire that electrically connects the electronic component and the inner lead inside the encapsulating resin body. The inner lead includes a base member made of a metal material, and a film disposed at least on a surface of the base member, the surface being adjacent to a bonding surface to which the bonding wire is connected. The film includes a metal thin film that is disposed on the surface of the base member and has a connection region at a part to which the bonding wire is connected, and an oxide film that is made of an oxide of the same metal as a metal being a main component metal of the metal thin film, and is disposed in at least a part of a region of the metal thin film, excluding the connection region to which the bonding wire is connected. The oxide film includes an uneven oxide film having a surface with continuous asperities. In the bonding surface, an end opposite to an end adjacent to the outer lead is referred to as a front end. The uneven oxide film is disposed in at least a part of a front end region that is a region of the bonding surface closer to the front end than the connection region.

As a result of intensive studies conducted by the present inventors, it became clear that the thermal stress generated based on a difference in coefficient of linear expansion between the encapsulating resin body and the lead frame concentrates on the front end of the bonding surface in the inner lead. In order to deal with this, in the electronic device according to the aspect of the present disclosure, the uneven oxide film is disposed on the metal thin film at least in a part of the front end region that is closer to the front end than the connection region. The surface of the uneven oxide film has continuous asperities, and thus peeling of the encapsulating resin body can be restricted by an anchor effect and the effect of increase in contact area. Therefore, it is less likely that the peeling of the encapsulating resin body will proceed to the connection region. That is, it is less likely that the bonding wire will be disconnected.

Further, since the oxide film is disposed on the metal thin film, the above-described effect can be achieved. As such, the configuration of the lead frame, eventually the electronic device can be simplified, while restricting the peeling of the encapsulating resin body.

In addition, the uneven oxide film having the surface with the continuous asperities is formed by irradiating the metal thin film with pulsed laser light. As such, the manufacturing process can be simplified, as compared with the conventional configuration.

According to a second aspect of the present disclosure, a method is for manufacturing an electronic device including: an electronic component; an encapsulating resin body that encapsulates the electronic component, a lead frame that includes an inner lead disposed inside the encapsulating resin body, and an outer lead connecting to the inner lead and protruding to an outside of the encapsulating resin body, the lead frame being extended over an inside and outside of the encapsulating resin body; and a bonding wire that electrically connects the electronic component and the inner lead inside the encapsulating resin body. The inner lead includes a base member made of a metal material, and a film disposed at least on a surface of the base member, the surface being adjacent to a bonding surface to which the bonding wire is connected. The film includes a metal thin film that is disposed on the surface of the base member and has a connection region at a part to which the bonding wire is connected, and an oxide film that is made of an oxide of the same metal as a metal being a main component metal of the metal thin film, and is disposed in at least a part of a portion on the metal thin film, excluding the connection region to which the bonding wire is connected. The oxide film includes an uneven oxide film having a surface with continuous asperities. The method for manufacturing the electronic device, comprising: preparing the base member on which the metal thin film is disposed; forming the uneven oxide film by irradiating at least a part of a front end region with pulsed laser light, the front end region being a region of the bonding surface that is closer to a front end than the connection region, the front end being opposite to an end of the bonding surface adjacent to the outer lead; connecting the electronic component and the inner lead via the bonding wire after the forming of the uneven oxide film; and molding the encapsulating resin body so as to cover the bonding wire, the electronic component, and the inner lead.

According to the method, the uneven oxide film having the surface with the continuous asperities is formed by irradiating the metal thin film with the pulsed laser light. This can restrict the peeling of the encapsulating resin body from proceeding to the connection region. That is, it is possible to restrict disconnection of the bonding wire. In addition, it is possible to simplify the configuration of the lead frame, eventually the electronic device. Furthermore, the manufacturing process can be simplified.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
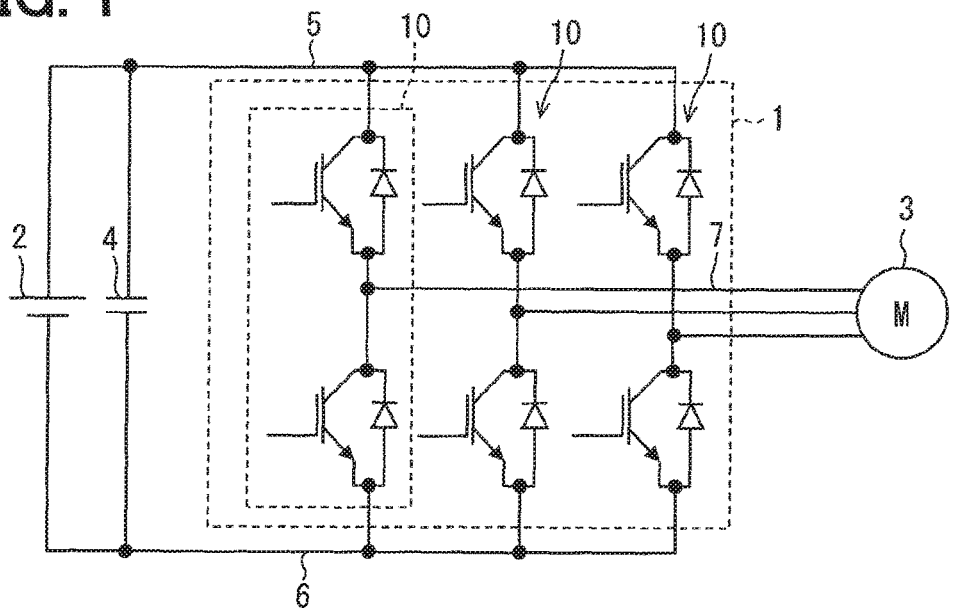
FIG. 1 is a diagram showing a schematic configuration of a power conversion device to which a semiconductor device of a first embodiment is applied.

Several embodiments will be described with reference to the drawings.

In several embodiments, parts that functionally and/or structurally correspond to each other are designated with the same reference numerals.

Hereinafter, a thickness direction of a semiconductor chip is indicated as a Z direction, and an extending direction of a main terminal and a signal terminal, which is orthogonal to the Z direction, is indicated as a Y direction. Further, a direction orthogonal to both the Z direction and the Y direction is indicated as an X direction. Unless otherwise specified, a shape along an XY plane defined by the X direction and the Y direction is defined as a planar shape.

First Embodiment

First, an example of a power conversion device to which a semiconductor device is applied will be described with reference to FIG. 1.

A power conversion device 1 shown in FIG. 1 is configured to convert a DC voltage supplied from a DC power source 2 (battery) into a three-phase AC and outputs the converted voltage to a motor 3 of a three-phase AC system. Such a power conversion device 1 is mounted in, for example, an electric vehicle or a hybrid vehicle. Note that the power conversion device 1 can also convert the power generated by the motor 3 into DC and charge the DC power source 2. Reference numeral 4 shown in FIG. 1 denotes a smoothing capacitor.

The power conversion device 1 includes a three-phase inverter. The three-phase inverter includes upper and lower arms for each of three phases between a high potential power supply line 5 connected to a positive electrode (high potential side) of the DC power source 2 and a low potential power supply line 6 connected to a negative electrode (low potential side) of the DC power source 2. The upper and lower arms of each phase are made of a semiconductor device 10. That is, one semiconductor device 10 constitutes upper and lower arms for one phase.

The semiconductor device 10 includes an IGBT element and an FWD element for reflux connected antiparallel to the IGBT element. In the present embodiment, an IGBT element and an FWD element are formed in a semiconductor chip 12 described later. However, the IGBT element and the FWD element may be formed in separate chips. In the present embodiment, an n-channel type IGBT element is employed. A cathode electrode of the FWD element is made common with a collector electrode, and an anode electrode of the FWD element is made common with an emitter electrode.

In the semiconductor device 10, the collector electrode of the IGBT element of the upper arm is electrically connected to the high potential power supply line 5, and the emitter electrode of the IGBT element of the upper arm is connected to an output line 7 to the motor 3. Meanwhile, the collector electrode of the IGBT element of the lower arm is connected to the output line 7 to the motor 3, and the emitter electrode of the IGBT element of the lower arm is electrically connected to the low potential power supply line 6.

In addition to the three-phase inverter described above, the power conversion device 1 may further include a boost converter that boosts a DC voltage supplied from the DC power source 2, and a control unit that controls operation of switching elements that constitute the three-phase inverter and the boost converter.

Next, a schematic configuration of the semiconductor device 10 will be described with reference to FIGS. 2 to 4.

Figure 2:
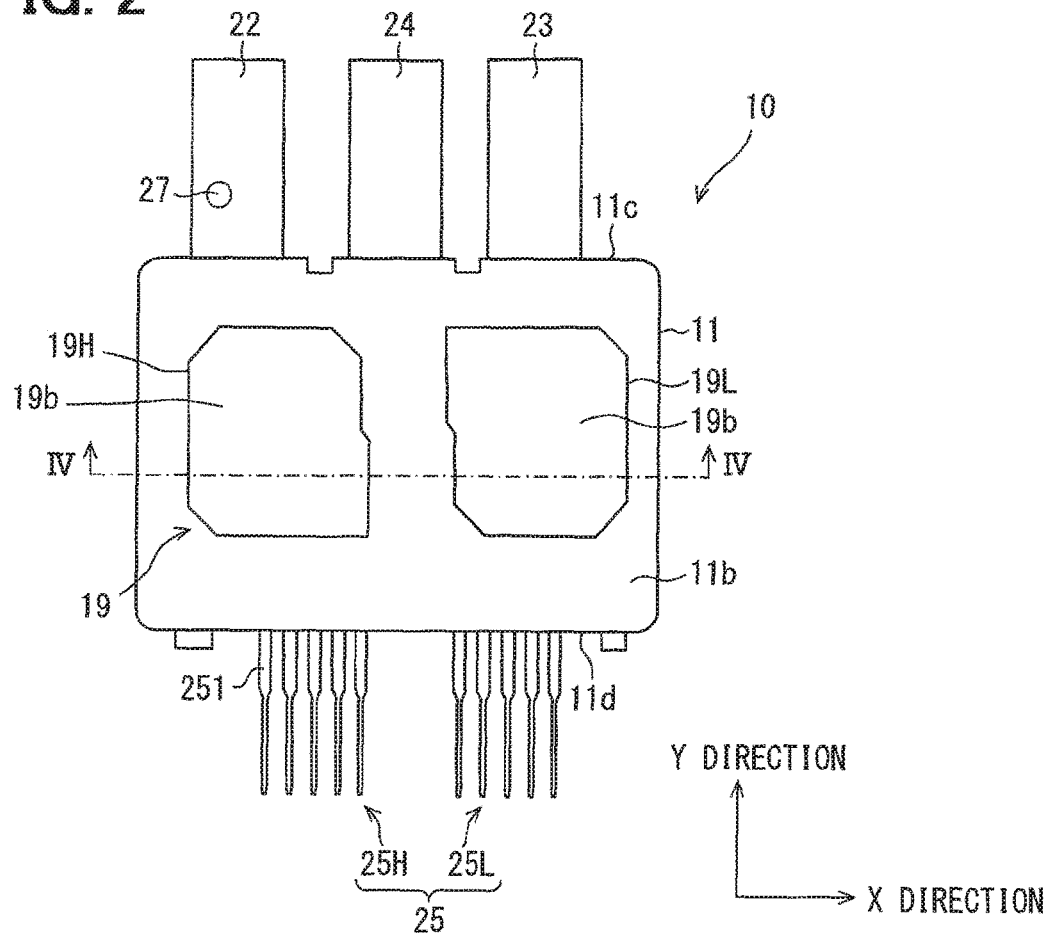
FIG. 2 is a plan view showing a schematic configuration of a semiconductor device according to the first embodiment.
Figure 3:
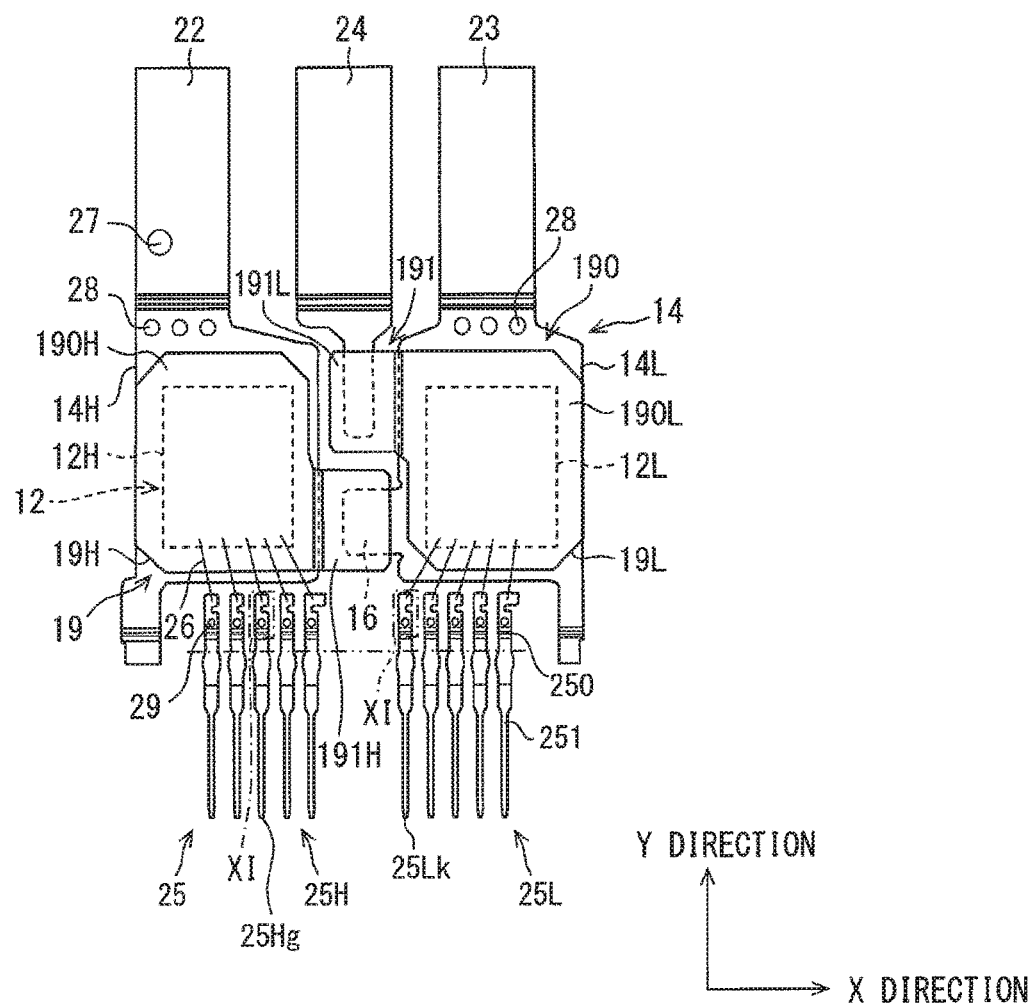
FIG. 3 is a view in which an encapsulating resin body is omitted from the semiconductor device shown in FIG. 2.
Figure 4:
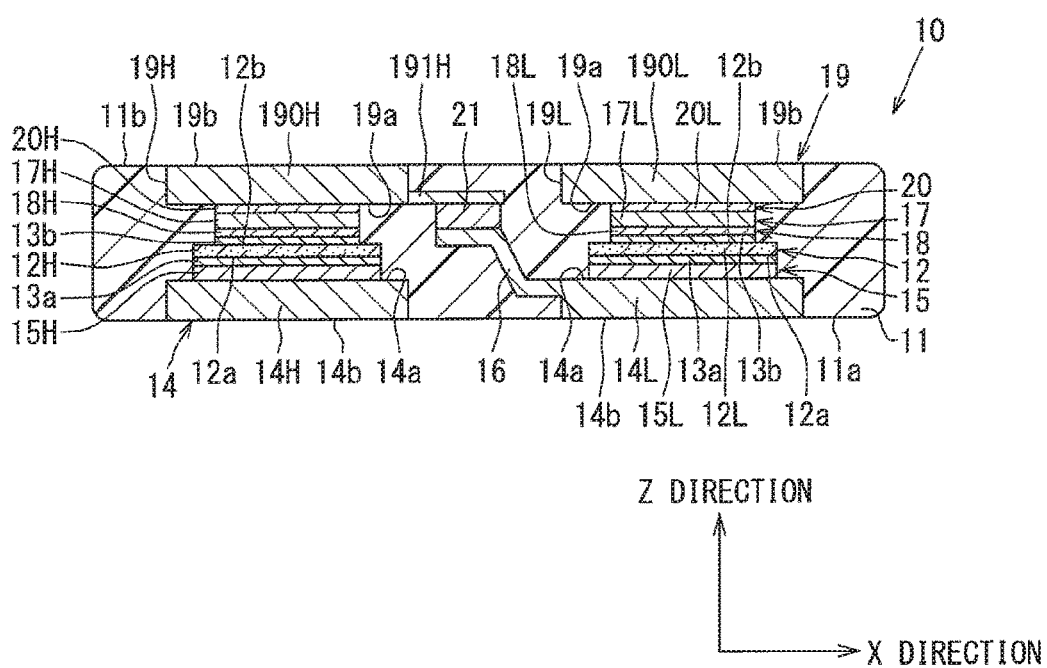
FIG. 4 is a sectional view taken along a line IV-IV in FIG. 2.

As illustrated in FIGS. 2 to 4, the semiconductor device 10 includes an encapsulating resin body 11, a semiconductor chip 12, a first heat sink 14, a joint portion 16, a terminal 17, a second heat sink 19, main terminals 22, 23, 24, and a signal terminal 25. The semiconductor device 10 corresponds to a resin-encapsulated type electronic device. In the following, H at the end of a reference numeral indicates that a corresponding element belongs to the upper arm, and L at the end of a reference numeral indicates that a corresponding element belongs to the lower arm. Some elements are indicated with H and L at the ends of the reference numerals thereof in order to clarify the upper arm and the lower arm, and some other elements are indicated with the common reference numerals irrespective to the upper arm and the lower arm.

The encapsulating resin body 11 is made of, for example, an epoxy resin. The encapsulating resin body 11 is formed by a transfer molding method, for example. The encapsulating resin body 11 has a substantially rectangular planar shape and has one surface 11a orthogonal to the Z direction, a rear surface 11b opposite to the one surface 11a, and side surfaces connecting the one surface 11a and the rear surface 11b. The one surface 11a and the rear surface 11b are, for example, flat surfaces. As the side surfaces, the encapsulating resin body 11 has a side surface 11c from which the main terminals 22, 23, 24 protrude and a side surface 11d from which the signal terminal 25 protrudes.

In the semiconductor chip 12, a power transistor such as an insulated gate bipolar transistor (IGBT) is formed on a semiconductor substrate such as silicon. In the present embodiment, an n-channel type IGBT and a commutating diode (FWD) connected in antiparallel to the IGBT are formed. That is, an RC (Reverse Conducting)-IGBT is formed in the semiconductor chip 12. The semiconductor chip 12 includes a substantially rectangular planar shape.

The IGBT and the FWD have a vertical structure so that a current flows in the Z direction. In the thickness direction of the semiconductor chip 12, namely in the Z direction, a collector electrode 13a is formed on one surface 12a and an emitter electrode 13b is formed on a rear surface 12b opposite to the one surface 12a. The collector electrode 13a also serves as the cathode electrode of the FWD, and the emitter electrode 13b also serves as the anode electrode of the FWD. A pad (not shown) including a pad for a gate electrode is formed on the rear surface 12b of the semiconductor chip 12, namely, on emitter electrode formation surface on which the emitter electrode is formed. The semiconductor chip 12 corresponds to an electronic component.

The semiconductor chip 12 includes a semiconductor chip 12H of the upper arm and a semiconductor chip 12L of the lower arm. The semiconductor chips 12H, 12L have almost the same planar shape, more specifically, substantially rectangular planar shape, and have substantially the same size and almost the same thickness. The semiconductor chips 12H, 12L are disposed so that their collector electrodes 13a are on the same side in the Z direction and their emitter electrodes 13b are on the same side in the Z direction. The semiconductor chips 12H, 12L are located at approximately the same height in the Z direction and are arranged side by side in the X direction.

The first heat sink 14 functions to dissipate the heat of the corresponding semiconductor chip 12 to the outside of the semiconductor device 10 and also functions as a wiring. Therefore, in order to ensure thermal conductivity and electric conductivity, the first heat sink 14 is formed using at least a metal material. The first heat sink 14 is also referred to as a heat radiation member. In the present embodiment, the first heat sink 14 is provided so as to encompass the corresponding semiconductor chip 12 in a projection view projected in the Z direction.

The first heat sink 14 has an opposing surface 14a opposed to the one surface 12a of the semiconductor chip 12 and a heat dissipating surface 14b opposite to the opposing surface 14a. The opposing surface 14a of the first heat sink 14 and the collector electrode 13a of the semiconductor chip 12 corresponding to the first heat sink 14 are electrically connected to each other via a solder 15. Most part of the first heat sink 14 is covered with the encapsulating resin body 11. The opposing surface 14a is disposed in the encapsulating resin body 11, and the heat dissipating surface 14b is exposed from the encapsulating resin body 11. Specifically, the heat dissipating surface 14b is substantially coplanar with the one surface 11a.

In the present embodiment, the first heat sink 14 includes a first heat sink 14H of the upper arm and a first heat sink 14L of the lower arm. The solder 15 also includes a solder 15H of the upper arm and a solder 15L of the lower arm. The first heat sink 14H is connected to the collector electrode 13a of the semiconductor chip 12H via the solder 15H. Further, the first heat sink 14L is connected to the collector electrode 13a of the semiconductor chip 12L via the solder 15L. The first heat sinks 14H, 14L are arranged side by side in the X direction and are arranged at approximately the same position in the Z direction. The heat dissipating surfaces 14b of the first heat sinks 14H, 14L are exposed from the one surface 11a of the encapsulating resin body 11 and are arranged side by side in the X direction with respect to each other.

As shown in FIGS. 3 and 4, a joint portion 16 connects to the first heat sink 14L of the lower arm. The joint portion 16 electrically relays the first heat sink 14L and a second heat sink 19H described later. In the present embodiment, the joint portion 16 is integrally provided with the first heat sink 14L by processing the same metal plate. The joint portion 16 is thinner than the first heal sink 14L so as to be covered by the encapsulating resin body 11. The joint portion 16 connects to the opposing surface 14a of the first heat sink 14L to form substantially a coplanar surface. The joint portion 16 extends from the vicinity of one end in the Y direction of the first heat sink 14L toward the second heat sink 19H. In the present embodiment, as shown in FIG. 4, the joint portion 16 includes two bent portions.

The terminal 17 is interposed between the semiconductor chip 12 and the corresponding second heat sink 19. Since the terminal 17 is located in the middle of the heat conduction and electric conduction path between the semiconductor chip 12 and the second heat sink 19, the terminal 17 is formed using at least a metal material (e.g., copper) in order to ensure thermal conductivity and electric conductivity. The terminal 17 is disposed opposite to the emitter electrode 13b and is electrically connected to the emitter electrode 13b via a solder 18.

In the present embodiment, the terminal 17 includes a terminal 17H of the upper arm and a terminal 17L of the lower arm. Further, the solder 18 includes a solder 18H of the upper arm and a solder 18L of the lower arm. The terminal 17H is connected to the emitter electrode 13b of the semiconductor chip 12H via the solder 18H. Further, the terminal 17L is connected to the emitter electrode 13b of the semiconductor chip 12L via the solder 18L.

The second heat sink 19 functions to dissipate the heat of the corresponding semiconductor chip 12 to the outside of the semiconductor device 10 and also functions as a wiring. Therefore, similarly to the first heat sink 14, the second heat sink 19 is formed using at least a metal material so as to ensure thermal conductivity and electric conductivity. The second heat sink 19 is also referred to as a heat radiation member. In the present embodiment, the second heat sink 19 is provided so as to encompass the corresponding semiconductor chip 12 in a projection view projected in the Z direction.

The second heat sink 19 has an opposing surface 19a opposed to the corresponding terminal 17 and a heat dissipating surface 19b opposite to the opposing surface 19a. The opposing surface 19a of the second heat sink 19 and the corresponding terminal 17 are electrically connected to each other via a solder 20. Most part of the second heat sink 19 is covered with the encapsulating resin body 11. The opposing surface 19a is disposed in the encapsulating resin body 11, and the heat dissipating surface 19b is exposed from the encapsulating resin body 11. Specifically, the heat dissipating surface 19b is substantially coplanar with the rear surface 11b.

In the present embodiment, the second heat sink 19 includes a second heat sink 19H of the upper arm and a second heat sink 19L of the lower arm. The solder 20 also includes a solder 20H of the upper arm and a solder 20L of the lower arm. Then, the second heat sink 19H and the terminal 17H are connected to each other via the solder 20H. Further, the second heat sink 19L and the terminal 17L are connected to each other via the solder 20L. The second heat sinks 19H, 19L are arranged side by side in the X direction and are arranged at approximately the same position in the Z direction. The heat dissipating surface 19b of the second heat sinks 19H, 19L are exposed from the rear surface 11b of the encapsulating resin body 11 and are also arranged side by side in the X direction.

In addition, as shown in FIG. 3, the second heat sinks 19H, 19L have a common shape. The second heat sink 19H and the second heat sink 19L are arranged to be two-fold symmetry. The second heat sink 19 has a substantially L-shaped planar surface, and includes a main body portion 190 connected to the corresponding terminal 17 via the solder 20 and an extended portion 191 extended from the main body portion 190.

The extended portion 191 is provided integrally with the main body portion 190 by processing the same metal plate. The extended portion 191 is thinner than the main body portion 190 so as to be covered by the encapsulating resin body 11. The extended portion 191 is connected to the main body portion 190 so that the opposing surface 19a is substantially flat. Further, the second heat sink 19 is disposed so that the extension direction of the extended portion 191 is along the X direction.

In the present embodiment, the second heat sink 19 includes a body portion 190H of the upper arm and a body portion 190L of the lower arm as the body portion 190. In addition, the extended portion 191 includes an extended portion 191H of the upper arm and an extended portion 191L of the lower arm. In the X direction, two second heat sinks 19H, 19L are disposed so that the extended portion 191H is opposed to the main body portion 190L and the extended portion 191L is opposed to the main body portion 190H. In other words, in the Y direction, two second heat sinks 19H, 19L are disposed so that the extended portions 191H, 191L are arranged side by side.

The extended portion 191H overlaps with the end of the joint portion 16 in a projection view projected in the Z direction. The extended portion 191H and the joint portion 16 are connected via a solder 21.

The main terminal 22 is connected to the high potential power supply line 5. Therefore, the main terminal 22 is also referred to as a high potential power supply terminal and a P terminal. The main terminal 22 is electrically connected to the first heat sink 14H, extends in the Y direction, and protrudes to the outside from the side surface 11c of the encapsulating resin body 11. In the present embodiment, the main terminal 22 is integrally provided with the first heat sink 14H by machining the same metal plate.

The main terminal 23 is connected to the output line 7 of the motor 3. Therefore, the main terminal 23 is also referred to as an output terminal and an O terminal. The main terminal 23 is electrically connected to the first heat sink 14L, extends in the Y direction, and protrudes to the outside from the same side surface 11c as the main terminal 22. In the present embodiment, by machining the same metal plate, the main terminal 23 is provided integrally with the first heat sink 14L.

The main terminal 24 is connected to the low potential power supply line 6. Hence, the main terminal 24 is also referred to as a low potential power supply terminal and an N terminal. The main terminal 24 is disposed so as to overlap with the extended portion 191L of the second heat sink 19L in a projection view projected in the Z direction. The main terminal 24 is disposed on the side adjacent to the semiconductor chip 12 than the extended portion 191L in the Z direction. Although not shown, the main terminal 24 and the extended portion 191L are also connected via the solder 21.

The main terminal 24 extends in the Y direction and protrudes to the outside from the same side surface 11c as the main terminals 22, 23. The protruding portions of the main terminals 22, 23, 24 from the encapsulating resin body 11 are arranged at substantially the same position in the Z direction. Further, in the X direction, the main terminal 22, the main terminal 24, and the main terminal 23 are arranged side by side in this order.

The signal terminal 25 is electrically connected to a pad of the corresponding semiconductor chip 12 via a bonding wire 26. In the present embodiment, an aluminum based bonding wire 26 is adopted. The signal terminal 25 extends in the Y direction and protrudes to the outside from the side surface 11d of the encapsulating resin body 11. Specifically, the signal terminal 25 protrudes to the outside from the side surface 11d opposite to the side surface 11c from which the main terminals 22, 23, 24 protrude.

In the present embodiment, the signal terminal 25 includes a signal terminal 25H of the upper arm and a signal terminal 25L of the lower arm. The signal terminal 25H is connected to the pad of the semiconductor chip 12H, and the signal terminal 25L is connected to the pad of the semiconductor chip 12L. Note that the signal terminal 25 corresponds to a lead frame. Details of the structure of the signal terminal 25 will be described later.

In the present embodiment, the first heat sinks 14H, 14L, the joint portion 16, the main terminals 22, 23, 24, and the signal terminal 25 are made of the same metal plate. That is, the lead frame includes the first heat sinks 14H, 14L, the joint portion 16, the main terminals 22, 23, 24, and the signal terminal 25. In this manner, the signal terminal 25 is substantially a part of the lead frame.

The semiconductor device 10 of the present embodiment has through holes 27, 28, 29. The through hole 27 is formed in the main terminal 22 in order to position the lead frame described above. The through hole 27 is formed in a portion of the main terminal 22 that is not covered with the encapsulating resin body 11. The through hole 28 is formed in the vicinity of a connecting portion between the first heat sinks 14H, 14L and the main terminals 22, 23 in order to restrict peeling of the encapsulating resin body 11. The through hole 28 is filled with the encapsulating resin body 11. The through hole 29 is formed in the signal terminal 25 in order to restrict peeling of the encapsulating resin body 11. The through hole 29 is formed in the inner lead 250 of the signal terminal 25, which will be described later. The through hole 29 is filled with the encapsulating resin body 11.

In the semiconductor device 10 configured as described above, the semiconductor chip 12, a part of the first heat sink 14, the joint portion 16, the terminal 17, a part of the second heat sink 19, the main terminal 22, a part of each of the main terminals 22, 23, 24, and a part of the signal terminal 25 are integrally encapsulated by the encapsulating resin body 11. In the semiconductor device 10, two semiconductor chips 12H, 12L constituting upper and lower arms for one phase are encapsulated by the encapsulating resin body 11. Therefore, the semiconductor device 10 is also called a 2 in 1 package.

As will be described later, the first heat sink 14 and the second heat sink 19 are cut together with the encapsulating resin body 11. The heat dissipating surfaces 14b of the first heat sinks 14H, 14L are located in the same plane and substantially coplanar with the one surface 11a of the encapsulating resin body 11. Likewise, the heat dissipating surfaces 19b of the second heat sinks 19H, 19L are located in the same plane and substantially coplanar with the rear surface 11b of the encapsulating resin body 11. In this manner, the semiconductor device 10 forms a double-sided heat dissipation structure in which the heat dissipating surfaces 14b, 19b are both exposed from the encapsulating resin body 11.

Figure 5:
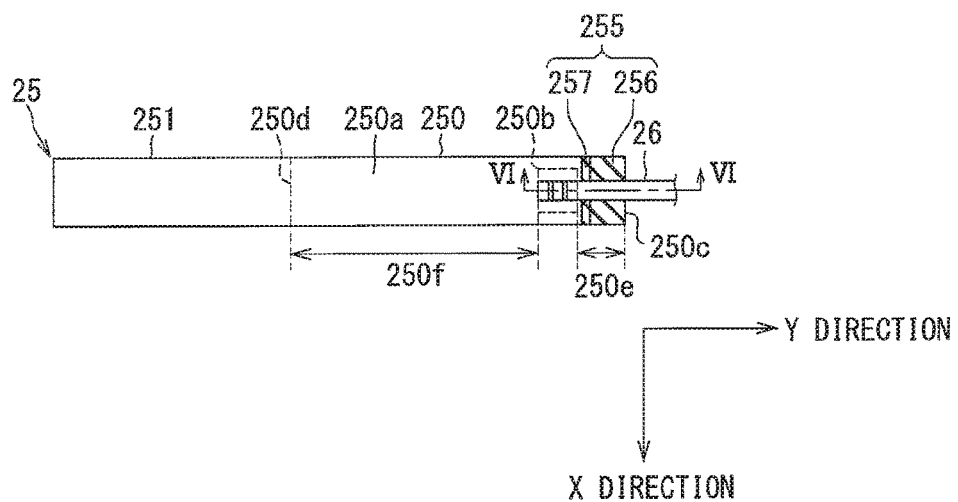
FIG. 5 is a plan view showing a signal terminal.
Figure 6:
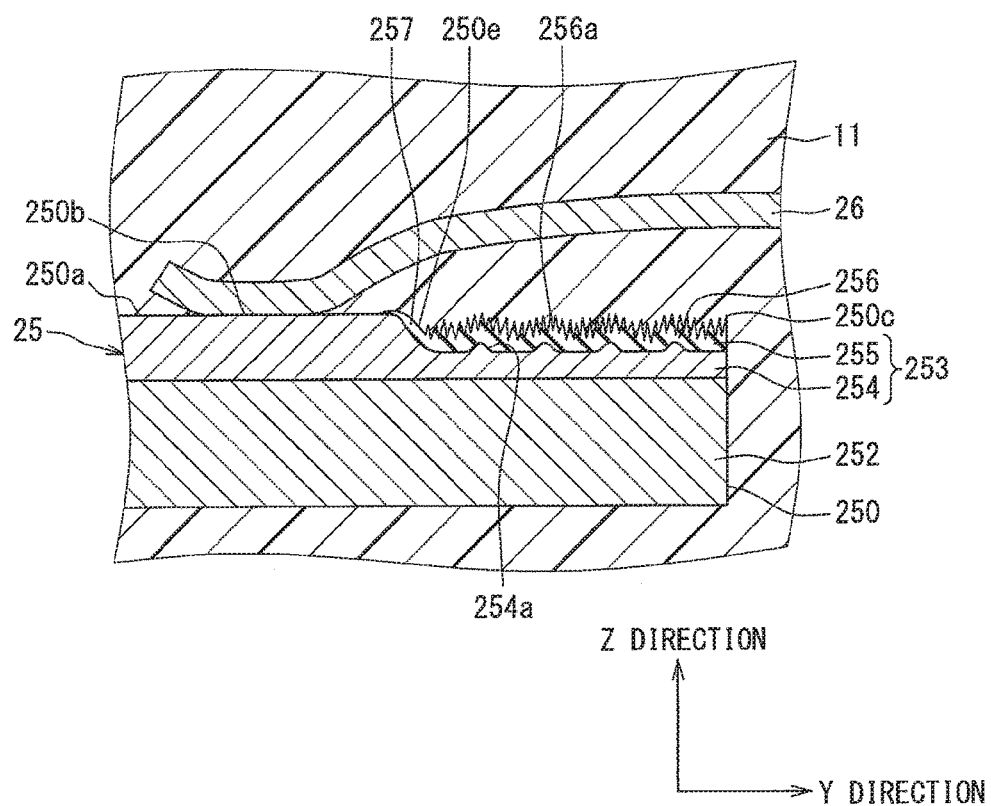
FIG. 6 is a sectional view taken along a line VI-VI in FIG. 5 and shows the state of being covered with an encapsulating resin body.

Next, a detailed structure of the signal terminal 25 and a connection structure between the signal terminal 25 and the bonding wire 26 will be described with reference to FIGS. 5 and 6. In FIG. 5, the plane shape of the signal terminal 25 is simplified for the sake of convenience. In FIG. 5, the encapsulating resin body 11 is omitted for the sake of convenience. Although FIG. 5 is a plan view, hatching is applied to an uneven oxide film 256 and an intermediate oxide film 257 for clarification. FIG. 6 is a sectional view taken along a line VI-VI of FIG. 5, and also shows the encapsulating resin body 11.

As shown in FIG. 5, the signal terminal 25 includes an inner lead 250 disposed inside the encapsulating resin body 11, and an outer lead 251 connecting to the inner lead 250 and protruding to the outside of the encapsulating resin body 11. In this manner, the signal terminal 25 extends over the inside and outside of the encapsulating resin body 11.

The inner lead 250 includes a base member 252 formed using a metal material and a film 253 formed at least on the surface of the base member 252 on the side of the bonding surface 250a of the inner lead 250 to which the bonding wire 26 is connected. In the present embodiment, Cu is used as the material of the base member 252. The entirety of the lead frame including the signal terminal 25 includes the base member 252.

The film 253 includes a metal thin film 254 and an oxide film 255. The metal thin film 254 is a film containing a metal as a constituent material. The metal thin film 254 is formed on the surface of the base member 252. That is, of the surfaces of the base member 252, the metal thin film 254 is formed on the surface of the base member 252 adjacent to the bonding surface 250a. In the example shown in FIG. 6, the metal thin film 254 is formed on the surface of the base member 252, the surface being adjacent to the bonding surface 250a. However, it is also possible to adopt a configuration in which the metal thin film 254 is formed on the entire surface of the base member 252. Further, it is also possible to adopt a configuration in which the metal thin film 254 is formed on the entire lead frame.

The metal thin film 254 of the present embodiment contains Ni as a main component. The metal thin film 254 is formed by, for example, plating or vapor deposition. The metal thin film 254 preferably includes a film containing Ni as a main component. The metal thin film 254 more preferably includes an electroless Ni plating film. In the present embodiment, the metal thin film 254 is made up of an electroless Ni plating film. The electroless Ni plating film contains P (phosphorus) in addition to the main component Ni.

When the irradiation conditions of laser light described later are the same, the thickness of the uneven oxide film 256 is larger in the electroless Ni plating film than in the electric Ni plating film. The melting point of the electroless Ni plating film (Ni—P) is about 800 degrees depending on the content of I°, and the melting point of the electroplated Ni plating film (Ni) is about 1450 degrees. In this manner, since the electroless Ni plating film has a lower melting point, it is considered that the thickness of the uneven oxide film 256 is increased by melting and evaporating with the low energy laser light.

The metal thin film 254 is formed on the surface of the base member 252, the surface being adjacent to the bonding surface 250a. As shown in FIG. 6, the surface of the metal thin film 254 is formed with a plurality of recessed portions 254a. The recessed portions 254a are formed by irradiation with pulsed laser light as described later. For example, one recessed portion 254a is formed by each pulse. The recessed portion 254a corresponds to a spot of the laser light. In the scanning direction of the laser light, adjacent recessed portions 254a are continuous. The width of each recessed portion 254a is 5 µm to 300 µm. Further, the depth of the recessed portion 254a is 0.5 µm to 5 µm.

When the depth of the recessed portion 254a is smaller than 0.5 µm, melting and vapor deposition of the surface of the metal thin film 254 due to irradiation of the laser light becomes insufficient, making it difficult for the uneven oxide film 256 described later to be formed. When the depth of the recessed portion 254a is larger than 5 µm, the surface of the metal thin film 254 is liable to melt and scatter, the surface formation due to fusion scattering becomes dominant over vapor deposition, and it becomes difficult for the uneven oxide film 256 to be formed.

An uneven oxide film 256 is formed on the recessed portion 254a of the surface of the metal thin film 254. As described above, the recessed portion 254a is a trace irradiated with laser light. In the metal thin film 254, the average thickness of the portion where the uneven oxide film 256 is formed is thinner than the average thickness of a portion where the uneven oxide film 256 is not formed (e.g., a rear end region 250f described later). As described above, also in the metal thin film 254, the average thickness of the portion where the uneven oxide film 256 is formed is also a trace of laser light irradiation.

The oxide film 255 is made of an oxide of the same metal as the main component metal constituting the metal thin film 254. The oxide film 255 is formed on the metal thin film 254. The oxide film 255 is formed at least in a part of the bonding surface 250a excluding the connection region 250b of the bonding wire 26. In FIG. 5, the connection region 250b is indicated by a broken line. For example, when the width of the signal terminal 25 is about 2.5 mm and the diameter of the bonding wire 26 is about 150 μm, the connection region 250b is about 600 μm square.

The oxide film 255 is formed by irradiating the metal thin film 254 with pulsed laser light to oxidize the metal constituting the metal thin film 254. That is, the oxide film 255 is an oxide film formed on the surface of the metal thin film 254 by oxidizing the surface layer of the metal thin film 254. It can thus be said that a part of the metal thin film 254 provides the oxide film 255. In the present embodiment, 80% of the components constituting the oxide film 255 are $NI_2O_3$, 10% is NiO, and 10% is Ni. As thus described, the main component of the oxide film 255 is an oxide of Ni, which is a main component of the metal thin film 254.

The oxide film 255 includes an uneven oxide film 256 and an intermediate oxide film 257. The uneven oxide film 256 has a surface formed with continuous asperities. The uneven oxide film 256 is formed on the metal thin film 254. The uneven oxide film 256 is formed on the surface of the metal thin film 254 in the area where the recessed portions 254a are formed. The average thickness of the uneven oxide film 256 is 10 nm to several hundred nm. The uneven oxide film 256 is formed following the irregularities of the surface of the metal thin film 254 having the recessed portions 254a. In addition, the asperities are formed with a pitch finer than the width of the recessed portion 254a. That is, very fine asperities are formed. In other words, a plurality of protrusions 256a (columnar bodies) are formed with a fine pitch. For example, the average width of the protrusions 256a is 1 nm to 300 nm, and the average interval between the protrusions 256a is 1 nm to 300 nm.

Here, on the bonding surface 250a of the inner lead 250, the end adjacent to the semiconductor chip 12 is defined as a front end 250c and the end adjacent to the outer lead 251 is defined as a rear end 250d. The position of the rear end 250d coincides with the position of the side surface 11d of the encapsulating resin body 11. In FIG. 5, the rear end 250d is indicated by a broken line. The uneven oxide film 256 is formed at least at a part of the front end region 250e which is a region of the bonding surface 250a adjacent to the front end 250c than the connection region 250b.

In the present embodiment, the uneven oxide film 256 is formed in a part of the front end region 250e including the front end 250c. On the other hand, on the bonding surface 250a, the uneven oxide film 256 is not formed in the rear end region 250f that is a region closer to the rear end 250d than the connection region 250b. In addition, the uneven oxide film 256 is not formed also in the regions on both sides of the connection region 250b in the X direction, namely in the region excluding the connection region 250b, the front end region 250e, and the rear end region 250f of the bonding surface 250a.

In the portion of the front end region 250e where the uneven oxide film 256 is formed, the uneven oxide film 256 forms a part of the bonding surface 250a. In the connection region 250b and the rear end region 250f, the metal thin film 254 forms the bonding surface 250a. A natural oxide film (not shown) is formed in a portion of the bonding surface 250a excluding the formation portion of the oxide film 255 where the oxide film 255 is formed and the bonding portion of the bonding wire 26 in the connection region 250b.

The intermediate oxide film 257 is formed between the uneven oxide film 256 and the connection region 250b. The intermediate oxide film 257 is formed adjacent to the uneven oxide film 256. The intermediate oxide film 257 is formed around the uneven oxide film 256. The surface of the intermediate oxide film 257 is not formed with fine asperities unlike the uneven oxide film 256. The intermediate oxide film 257 has a smoother surface than the uneven oxide film 256. The thickness of the intermediate oxide film 257 is larger than the above-described natural oxide film and smaller than the average thickness of the uneven oxide film 256. In the present embodiment, the intermediate oxide film 257 is formed only in the front end region 250e.

Next, a method for manufacturing the above-described semiconductor device 10 (electronic device) will be described with reference to FIGS. 6 to 10.

Figure 7:
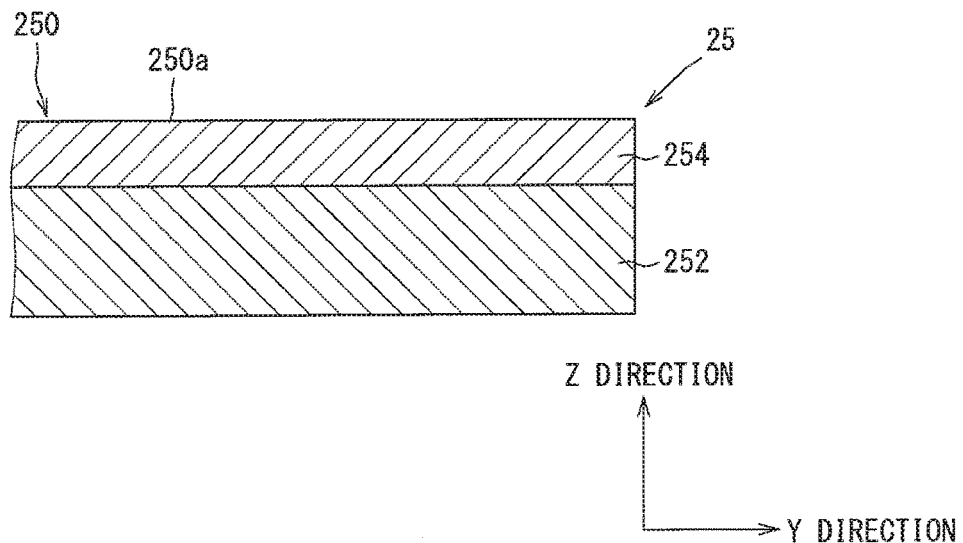
FIG. 7 is a sectional view showing a method for manufacturing a semiconductor device and corresponds to FIG. 6.

First, each element constituting the semiconductor device 10 is prepared. That is, the semiconductor chip 12, the first heat sink 14, the joint portion 16, the terminal 17, the second heat sink 19, the main terminals 22, 23, 24, and the signal terminal 25 are prepared separately. In this preparation step, as shown in FIG. 7, the signal terminal 25 having the inner lead 250 in which a metal thin film 254 has been formed on at least the surface of the base member 252 adjacent to the bonding surface 250a is prepared.

In the present embodiment, the signal terminal 25 having an electroless Ni plating film formed as the metal thin film 254 is prepared. At this time, the thickness of the electroless Ni film is about 10 μm. In addition, the signal terminal 25 is prepared as a part of the lead frame together with the first heat sink 14, the joint portion 16, and the main terminals 22, 23, 24.

Figure 8:
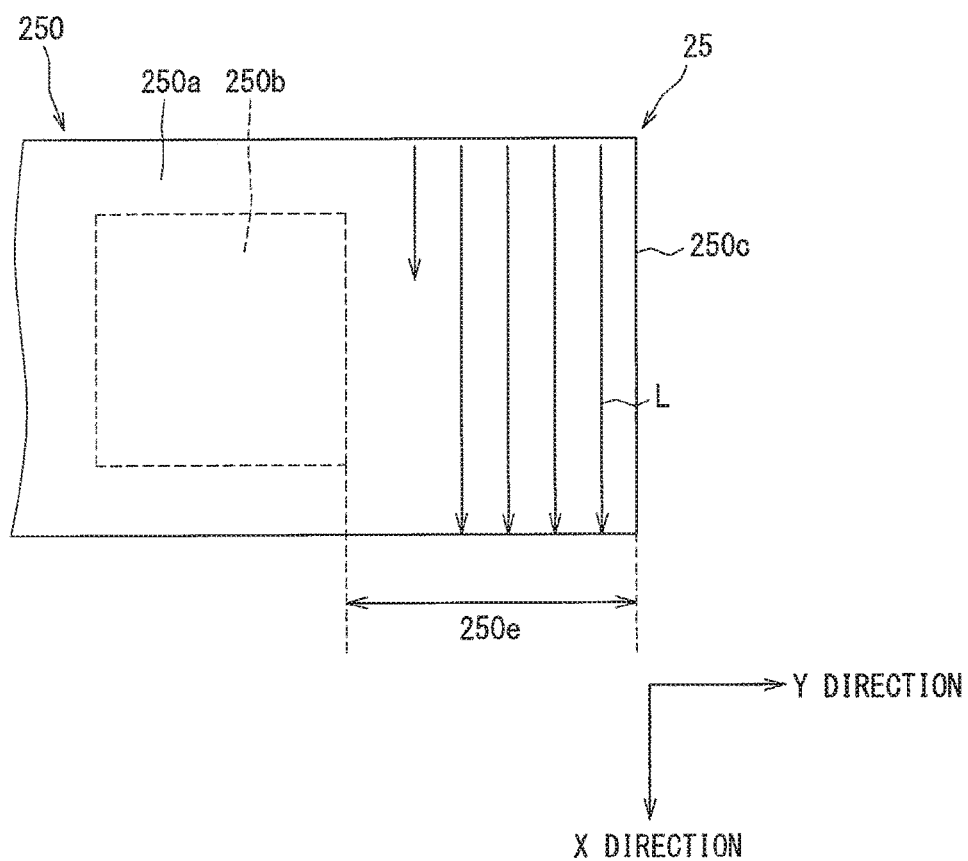
FIG. 8 is a plan view showing a laser light irradiation step.

Next, an oxide film 255 is formed by irradiation with laser light. The surface of the metal thin film 254 in the inner lead 250 is irradiated with pulsed laser light to melt and evaporate the surface of the metal thin film 254. Specifically, by irradiation with laser light, the surface portion of the metal thin film 254 is melted and evaporated (vaporized) so as to be suspended in the outside air. Pulsed laser light is adjusted so that the energy density is larger than 0 $J/cm^2$ and not larger than 100 $J/cm^2$ and the pulse width is not larger than 1 μs. In order to satisfy this condition, a YAG laser, a YVO4 laser, a fiber laser, or the like can be adopted. For example, in the case of the YAG laser, the energy density may be not smaller than 1 $J/cm^2$. In the case of electroless Ni plating, the metal thin film 254 can be processed even at about 5 $J/cm^2$, for example. The energy density is also referred to as pulse fluence, At this time, by relatively moving the light source of the laser light and the signal terminal 25, as shown in FIG. 8, the laser light is sequentially applied to a plurality of positions of the front end region 250e of the bonding surface 250a. Note that the light source of the laser light may be moved or the signal terminal 25 may be moved. Further, laser light may be scanned by the rotation operation of the mirror. That is, laser light may be sequentially applied to a plurality of positions of the front end region 250e by scanning the laser light.

For example, as shown in FIG. 8, when the laser light is scanned in the X direction and the irradiation from one end to the other end of the bonding surface 250a is completed, the irradiation region with the laser light is shifted in the Y direction. That is, the laser light is scanned in the Y direction. Then, similarly, one end to the other end is irradiated with the laser light by scanning in the X direction. By repeating this, a part of the front end region 250e is irradiated with the laser light from the front end 250c. That is, lattice points at a predetermined pitch in XY coordinates are irradiated with the laser light. In FIG. 8, as indicated by a solid line arrow L, irradiation is performed with the laser light from the front end 250c side in the Y direction.

In the present embodiment, laser light is scanned in the X direction with the spots (the irradiation range by one pulse) of the adjacent laser light partially overlapping in the X direction. Further, the laser light is scanned in the Y direction with the spots of the adjacent laser light partially overlapping in the Y direction. In this manner, by irradiation with the laser light and melting and vaporization of the surface of the metal thin film 254, the recessed portions 254a are formed on the surface of the metal thin film 254. The average thickness of the portion of the metal thin film 254, which is irradiated with the laser light, is smaller than the average thickness of the portion not irradiated with the laser light. In addition, the plurality of recessed portions 254a formed corresponding to the spots of the laser light are continuous in the X direction and also in the Y direction. As a result, the recessed portions 254a, which are laser irradiation marks, have, for example, a scaly shape.

Next, the portion of the molten metal thin film 254 is solidified. Specifically, the melted and vaporized metal thin film 254 is vapor-deposited on a portion irradiated with the laser light and its peripheral portion. By vapor-depositing the melted and vaporized metal thin film 254 in this manner, the oxide film 255 including the uneven oxide film 256 and the intermediate oxide film 257 is formed on the surface of the metal thin film 254. The uneven oxide film 256 is mainly formed in a portion irradiated with laser light in the metal thin film 254. The intermediate oxide film 257 is mainly formed around the portion irradiated with the laser light.

Figure 9:
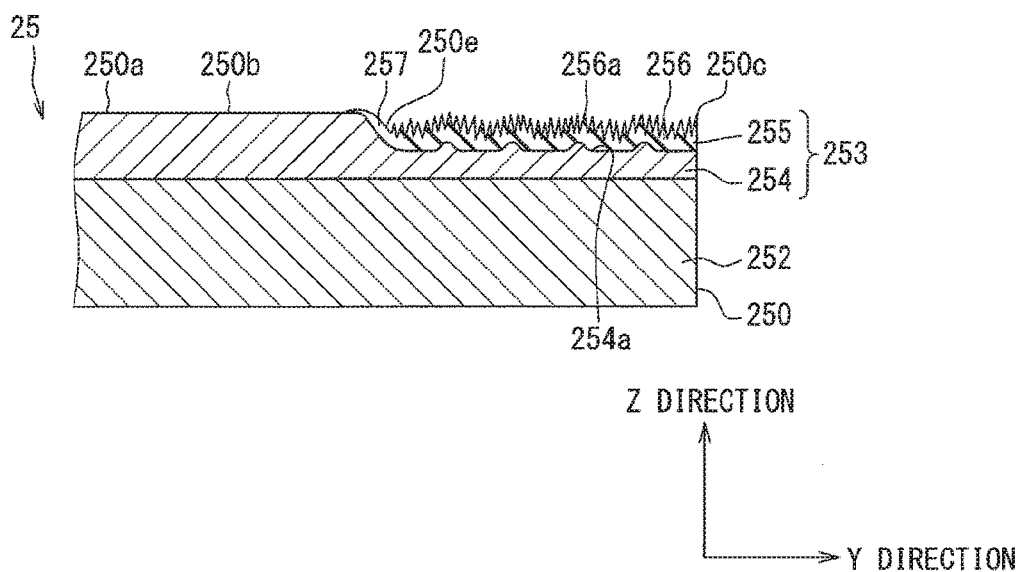
FIG. 9 is a sectional view showing a state after laser light irradiation and corresponds to FIG. 6.

As a result, as shown in FIG. 9, the uneven oxide film 256 and the intermediate oxide film 257 are formed in the front end region 250e of the bonding surface 250a of the inner lead 250 in the signal terminal 25. The thickness of the intermediate oxide film 257 formed by the irradiation with the laser light is sufficiently thick as compared with the natural oxide film. Further, the average thickness of the uneven oxide film 256 is larger than that of the intermediate oxide film 257. As described above, the step of irradiation with laser light, in other words, the step of forming the oxide film 255 is completed.

In irradiation with laser light, when the energy density was set to 150 J/cm$^2$ or 300 J/cm$^2$, being larger than 100 J/cm$^2$, the uneven oxide film 256 was not formed. In addition, the uneven oxide film 256 was not formed even when irradiated with continuous oscillation laser light instead of pulse oscillation.

Next, the semiconductor chip 12 and the first heat sink 14 are connected via the solder 15 to form a connection body. Explanation will be made by taking the connection body of the upper arm as an example.

First, the semiconductor chip 12H is disposed on the opposing surface 14a of the first heat sink 14H via the solder 15H. Next, on the semiconductor chip 12H, for example, the terminal 17H, in which the solders 18H, 20H are preliminarily arranged as pick-up solder on both surfaces, is disposed so that the solder 18H is adjacent to the semiconductor chip 12H. The solder 20H is provided with the amount capable of absorbing the height variation in the semiconductor device 10.

Then, in this stacked state, the solder 15H, 18H, 20H is re-flowed (1st reflow) to connect the semiconductor chip 12H and the first heat sink 14H via the solder 15H. Further, the semiconductor chip 12H and the terminal 17H are connected via the solder 18H. With regard to the solder 20H, since the second heat sink 19H to be connected has not been arranged yet, the solder 20H has a shape raised with the center of the surface opposed to the second heat sink 19H as a vertex due to the surface tension.

Note that the connection body of the lower arm can also be formed in the same manner. The difference is that the solder 21 is disposed on the surface of the joint portion 16 opposed to the extended portion 191H before the reflow. Similarly to the solder 20, the solder 21 is provided with the amount capable of absorbing the height variation in the semiconductor device 10.

Figure 10:
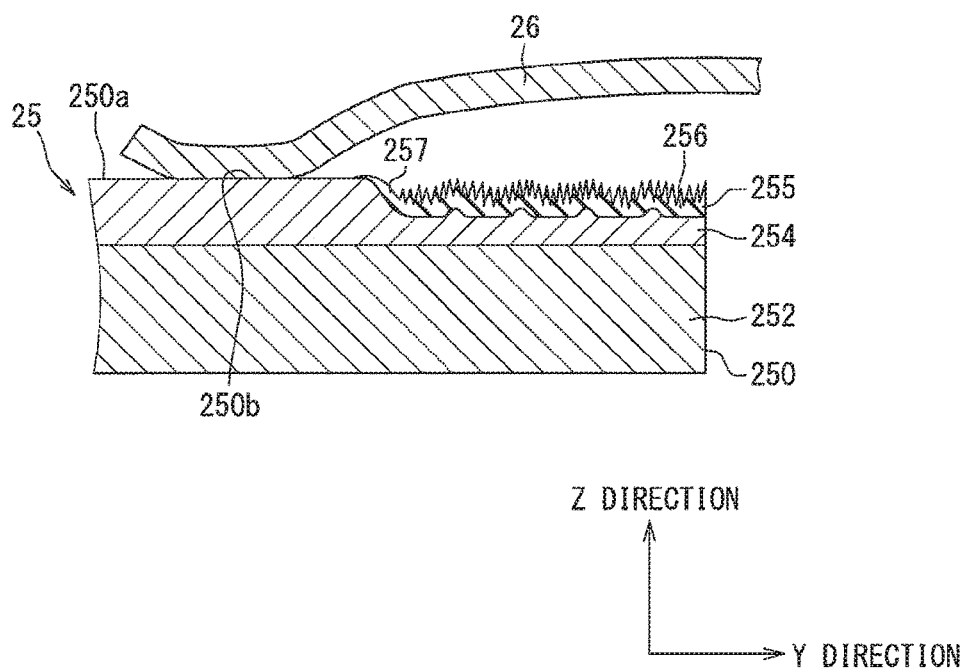
FIG. 10 is a sectional view showing a bonding wire connecting step and corresponds to FIG. 6.

Next, as shown in FIG. 10, the signal terminal 25 and the corresponding pad of the semiconductor chip 12 are connected by the bonding wire 26. For example, one end of the bonding wire 26 is bonded to the connection region 250b on the bonding surface 250a of the inner lead 250 by ultrasonic bonding. That is, the bonding wire 26 and the metal thin film 254 are bonded. As a result, the semiconductor chip 12 and the signal terminal 25 are electrically connected via the bonding wire 26.

Next, each of the above-described connection bodies and the corresponding second heat sink 19 are connected via the solder 20. Further, the connection body of the upper arm and the connection body of the lower arm are connected via the solder 21. Further, the main terminal 24 and the extended portion 191L are connected via the solder 21. That is, the solder 20, 21 is re-flowed simultaneously (2nd reflow).

First, the second heat sinks 19H, 19L are arranged on a base (not shown) with the opposing surface 19a facing up. At this time, for example, solder foil is disposed as the solder 21 on the opposing surface 191a of the extended portion 191L of the second heat sink 19L. This solder 21 is also provided with the amount capable of absorbing the height variation in the semiconductor device 10. Note that the pick-up solder may be previously performed on the main terminal 24.

Next, the connection bodies are arranged on the opposing surface 19a of the second heat sinks 19H, 19L so that the terminals 17H, 17L are opposed to the corresponding second heat sinks 19H, 19L. One of the solders 21 is sandwiched between the joint portion 16 and the extended portion 191H. The other of the solders 21 is sandwiched between the extended portion 191L and the main terminal 24.

Then, the 2nd reflow is performed in a state in which the second heat sinks 19H, 19L face down. In the 2nd reflow, a load is applied from the side of the first heat sinks 14H, 14L so that the height of the semiconductor device 10 becomes a predetermined height. Specifically, a spacer (not shown) is disposed between the main body portions 190H, 190L of the second heat sinks 19H, 19L and the pedestal, and the main body portions 190H, 190L and the pedestal are brought into contact with the spacer. In this manner, the height of the semiconductor device 10 is set to a predetermined height.

As described above, the solder 20H, 20L with the amount capable of absorbing the height variation is disposed between the terminals 17H, 17L and the second heat sinks 19H, 19L. Hence in the 2nd reflow, the solder 20H, 20L between the terminals 17H, 17L and the second heat sinks 19H, 19L is not deficient and reliable connection can be performed. Further, the solder 21 with the amount capable of absorbing a variation in height is disposed between the extended portion 191H and the joint portion 16. Therefore, in the 2nd reflow, the solder 21 between the extended portion 191H and the joint portion 16 is not deficient, and reliable connection can be performed. Further, the solder 21 with the amount capable of absorbing a variation in height is disposed between the extended portion 191L and the main terminal 24. Therefore, in the 2nd reflow, the solder 21 between the extended portion 191L and the main terminal 24 is not deficient, and reliable connection can be performed.

The 1st reflow and the 2nd reflow are reflow under a hydrogen atmosphere. As a result, the natural oxide film on the metal surface unnecessary for soldering can be removed by reduction. Therefore, fluxless solder can be used as the solder 15, 18, 20, 21. In addition, it is possible to restrict the occurrence of voids in the solder 15, 18, 20, 21 due to the reduced pressure. Since the oxide film 255 is also reduced in thickness due to reduction, the uneven oxide film 256 having a desired thickness is formed by irradiation with laser light so that at least the uneven oxide film 256 remains even when reduced. As described above, when the metal thin film 254 contains an electroless Ni plating film, the uneven oxide film 256 can be made thicker than the electro Ni plating film, which is preferable.

Next, molding of the encapsulating resin body 11 shown in FIG. 6 is carried out by the transfer molding method. At this time, the encapsulating resin body 11 is molded so as to cover the semiconductor chip 12, the inner lead 250 of the signal terminal 25, and the bonding wire 26. In the present embodiment, the encapsulating resin body 11 is formed such that not only the semiconductor chip 12, the inner lead 250 of the signal terminal 25, and the bonding wire 26, but also the first heat sink 14, the joint portion 16, the terminal 17, and the second heat sink 19 are encapsulated completely. Then, the encapsulating resin body 11 molded is cut along with a part of the first heat sink 14 and a part of the second heat sink 19 to expose the heat dissipating surfaces 14b, 19b of the first heat sink 14 and the second heat sink 19.

The encapsulating resin body 11 may be molded in a state in which the heat dissipating surfaces 14b, 19b are pressed against the cavity wall surface of the molding die and are in close contact with each other. In this case, the heat dissipating surfaces 14b, 19b are exposed from the encapsulating resin body 11 at the time of molding the encapsulating resin body 11. This eliminates the need for cutting after molding.

Then, by removing unnecessary portions of the lead frame, the semiconductor device 10 can be obtained.

Next, effects of the semiconductor device 10 and the manufacturing method thereof will be described.

Figure 11:
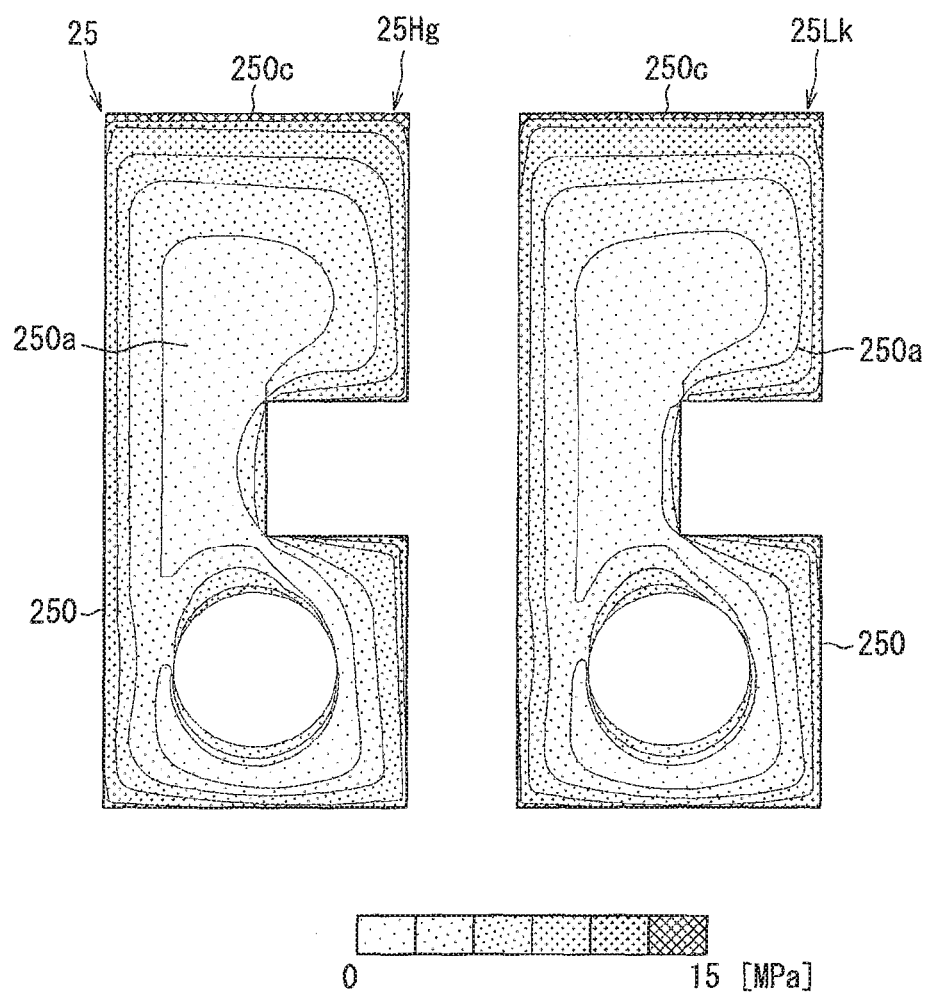
FIG. 11 is a diagram showing a stress analysis result.

The present inventors conducted intensive studies on peeling of the encapsulating resin body 11 at the signal terminal 25 (lead frame). At that time, the stress generated at the time of change in temperature from 175° C. to −40° C. was analyzed. FIG. 11 shows a stress analysis result of a region XI of the signal terminal 25 indicated by a dashed line in FIG. 3.

In the semiconductor chip 12, a pad for the gate electrode, a pad for Kelvin emitter for detecting the potential of the emitter electrode 13b, a pad for current sense, a pad for the anode potential of a temperature sensitive diode for detecting the temperature of the semiconductor chip 12, a pad for the same cathode potential are formed separately. In the present embodiment, those pads for cathode potential, anode potential, gate electrode, current sense, and Kelvin emitter are formed in this order from one end side in the X direction. Therefore, one of the two signal terminals 25 shown in FIG. 11 is a gate terminal 25Hg corresponding to the pad for the gate electrode of the semiconductor chip 12H, the other is a cathode terminal 25Lk corresponding to the pad for the cathode potential of the semiconductor chip 12L.

As shown in FIG. 11, it was found that the thermal stress generated based on the difference in linear expansion coefficient between the encapsulating resin body 11 and the signal terminal 25 concentrates on the front end 250c of the bonding surface 250a of the inner lead 250. Moreover, it became clear that the thermal stress concentrates on the front end 250c irrespective of the position of the signal terminal 25. The thermal stress showed the maximum value at the front end 250c.

On the other hand, in the present embodiment, the uneven oxide film 256 is formed on the metal thin film 254 in at least a part of the front end region 250e of the bonding surface 250a. The surface of the uneven oxide film 256 has fine asperities. This leads to an increase in contact area between the encapsulating resin body 11 and the front end region 250e. In addition, the encapsulating resin body 11 is entangled with the asperities of the uneven oxide film 256 to generate an anchor effect. Therefore, the adhesion between the front end region 250e and the encapsulating resin body 11 can be improved to restrict peeling of the encapsulating resin body 11. Hence it is possible to restrict the peeling of the encapsulating resin body 11 from proceeding to the connection region 250b. That is, it is possible to restrict disconnection of the bonding wire 26.

In addition, by employing the configuration in which the uneven oxide film 256 is formed on the metal thin film 254, the above-described effect can be obtained. Therefore, the configuration of the signal terminal 25, eventually the semiconductor device, can be simplified as compared with the conventional configuration, while the peeling of the encapsulating resin body 11 is restricted.

In addition, the base member 252 on which the metal thin film 254 is formed is prepared, and the metal thin film 254 is irradiated with pulsed laser light to form the uneven oxide film 256. After the uneven oxide film 256 is formed, the pad of the semiconductor chip 12 and the signal terminal 25 are connected via the bonding wire 26, and then the encapsulating resin body 11 is molded. Thus, the semiconductor device 10 is obtained. In particular, peeling of the encapsulating resin body 11 can be restricted merely by irradiating the metal thin film with a laser light to form an uneven oxide film. Hence it is possible to simplify the manufacturing process as compared with the conventional process.

As thus described, it is possible to simplify the configuration and the manufacturing process of the semiconductor device 10 while restricting the disconnection of the bonding wire 26 due to the peeling of the encapsulating resin body 11. In addition, corrosion of the metal thin film 254 can be restricted by forming the uneven oxide film 256 on the metal thin film 254. As a result, peeling of the encapsulating resin body 11 due to corrosion of the metal thin film 254 can be restricted.

In particular, in the present embodiment, the uneven oxide film 256 is formed in the region including the front end 250c. Therefore, at the front end 250c where peeling is most likely to occur, the peeling of the encapsulating resin body 11 can be restricted by the increase in contact area and anchor effect described above. It is thus effective for restricting disconnection of the bonding wire 26.

Further, in the present embodiment, the intermediate oxide film 257 is formed as the oxide film 255. Therefore, in the portion where the intermediate oxide film 257 is formed, corrosion of the metal thin film 254 can be restricted. As a result, peeling of the encapsulating resin body 11 due to corrosion of the metal thin film 254 can be restricted.

Second Embodiment

The present embodiment can refer to the preceding embodiment. Therefore, descriptions of parts common to the semiconductor device 10 and the method for manufacturing the same shown in the preceding embodiment will be omitted.

Figure 12:
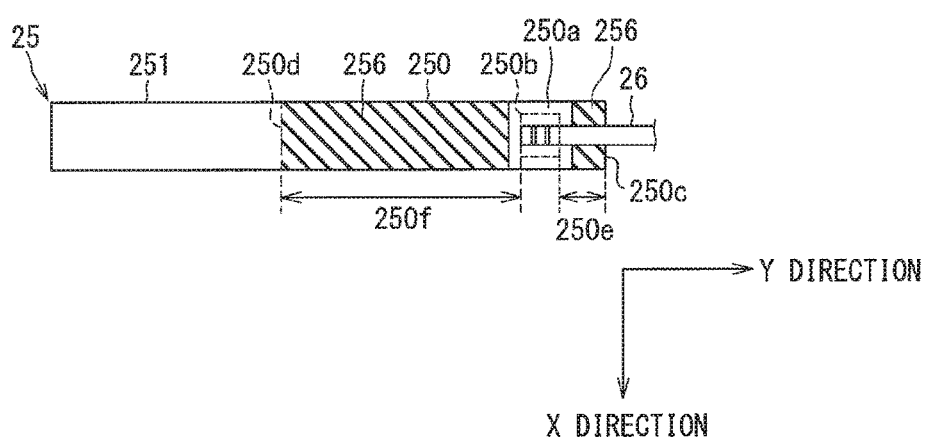
FIG. 12 is a plan view showing a signal terminal of a semiconductor device according to a second embodiment.

In the present embodiment, as shown in FIG. 12, the uneven oxide film 256 is formed on the bonding surface 250a not only in the front end region 250e but also in at least a part of the rear end region 250f. In FIG. 12, in the Y direction, the uneven oxide film 256 is formed in almost the entire region of the rear end region 250f beginning from the rear end 250d. Similarly to FIG. 5, also in FIG. 12, hatching is applied to the uneven oxide film 256 for clarification.

In FIG. 12, illustration of the intermediate oxide film 257 is omitted for the sake of convenience. The intermediate oxide film 257 is formed between the connection region 250b and the uneven oxide film 256 formed in the front end region 250e and between the connection region 250b and the uneven oxide film 256 formed in the rear end region 250f.

According to this, the peeling of the encapsulating resin body 11 is also restricted in the rear end region 250f. It is thus possible to restrict entry of moisture, corrosive gas, or the like into the interface between the encapsulating resin body 11 and the signal terminal 25 from the side surface 11d of the encapsulating resin body 11.

Third Embodiment

The present embodiment can refer to the preceding embodiment. Therefore, descriptions of parts common to the semiconductor device 10 and the method for manufacturing the same shown in the preceding embodiment will be omitted.

Figure 13:
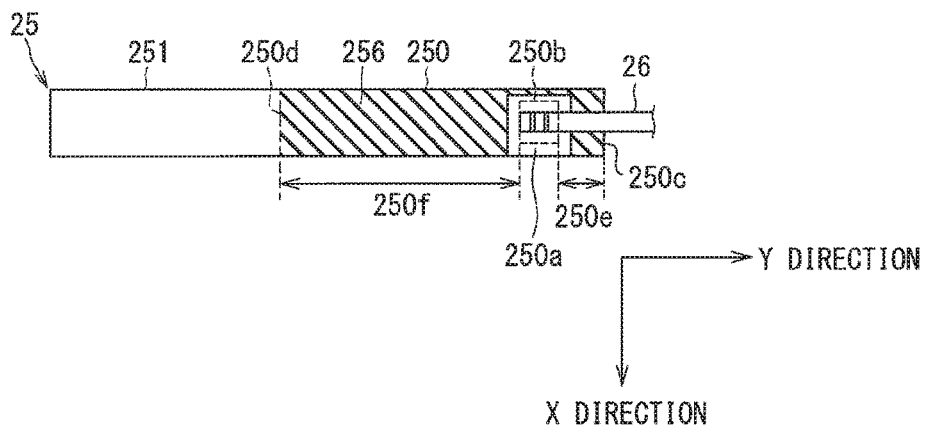
FIG. 13 is a plan view showing a signal terminal of a semiconductor device according to a third embodiment.

In the present embodiment, as shown in FIG. 13, the uneven oxide film 256 is also formed at a position next to the connection region 250b in the X direction, which is the width direction of the signal terminal 25. The uneven oxide film 256 formed in the front end region 250e and the uneven oxide film 256 formed in the rear end region 250f are integrally connected through the uneven oxide film 256 formed next to the connection region 250b in the X direction, on one side of the connection region 250b in the X direction. Similarly to FIG. 5, also in FIG. 13, hatching is applied to the uneven oxide film 256 for clarification. Further, similarly to FIG. 12, the illustration of the intermediate oxide film 257 is omitted.

According to this, it is possible to restrict the encapsulating resin body 11 from peeling from the end in the X direction and to restrict the peeling from proceeding to the connection region 250b.

Fourth Embodiment

The present embodiment can refer to the preceding embodiment. Therefore, descriptions of parts common to the semiconductor device 10 and the method for manufacturing the same shown in the preceding embodiment will be omitted.

Figure 14:
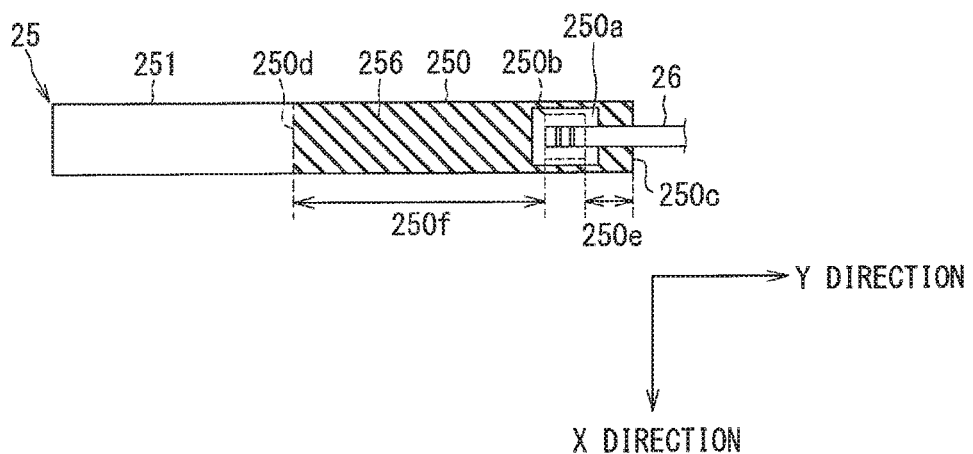
FIG. 14 is a plan view showing a signal terminal of a semiconductor device according to a fourth embodiment.

In the present embodiment, as shown in FIG. 14, the uneven oxide film 256 is formed on both sides of the connection region 250b in the X direction. The uneven oxide film 256 formed in the front end region 250e and the uneven oxide film 256 formed in the rear end region 250f are integrally connected through the uneven oxide films 256 formed on both sides of the connection region 250b in the X direction. That is, the uneven oxide film 256 surrounds the connection region 250b. Similarly to FIG. 5, also in FIG. 14, hatching is applied to the uneven oxide film 256 for clarification. Further, similarly to FIG. 12, the illustration of the intermediate oxide film 257 is omitted.

According to this, it is possible to restrict peeling of the encapsulating resin body 11 on both sides in the X direction of the connection region 250b. In addition, since the uneven oxide film 256 surrounds the connection region 250b, it is possible to restrict the peeling from proceeding in either direction.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In the above embodiment, the example of the 2 in 1 package having two semiconductor chips 12 is shown as the semiconductor device 10. However, the number of the semiconductor chips 12 is not limited. The present embodiment can also be applied to, for example, a 1 in 1 package having only one of six semiconductor chips 12 constituting upper and lower arms for three phases and a 6 in 1 package having six semiconductor chips 12.

Although the example in which the IGBT and the FWD are formed on the same chip has been shown, the present embodiment is also applicable to a configuration formed on separate chips.

Although the example in which the semiconductor device 10 includes the terminal 17 has been shown, the terminal 17 may be omitted. In this case, the second heat sink 19 may be provided with a protrusion protruding toward the emitter electrode 13b.

The heat dissipating surfaces 14b, 19b are exposed from the encapsulating resin body 11. However, the present embodiment can also be applied to a configuration in which the heat dissipating surfaces 14b, 19b are not exposed from the encapsulating resin body 11.

Although an example of the semiconductor device 10 has been shown as a resin-encapsulated type electronic device, this is not restrictive. The electronic device may only include an electronic component, an encapsulating resin body for encapsulating the electronic component, a lead frame extending over the inside and outside of the encapsulating resin body, and a bonding wire for electrically connecting the electronic component and an inner lead inside the encapsulating resin body. As an electronic component, for example, a microcomputer can be adopted.

The metal constituting the metal thin film 254 is not limited to Ni. In addition, the oxide film 255 is not limited to the oxide of Ni. The oxide film 255 may be an oxide of the same metal as the metal constituting the metal thin film 254.

Figure 15:
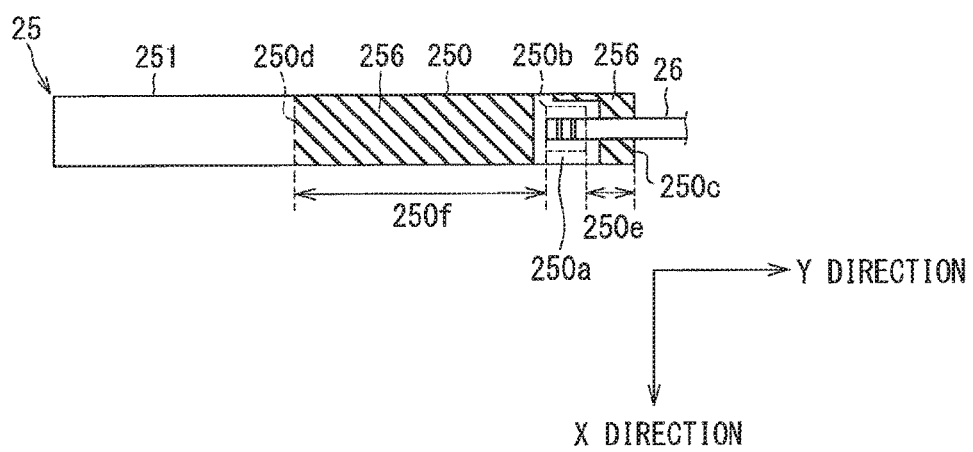
FIG. 15 is a plan view of a signal terminal as a first modification.

The formation pattern of the uneven oxide film 256 is not limited to the above example. For example, in the first modification shown in FIG. 15, the uneven oxide film 256 is formed at a position next to the connection region 250b in the X direction. The uneven oxide film 256 formed next to the connection region 250b connects only to the uneven oxide film 256 formed in the front end region 250e. Although not shown, the uneven oxide films 256 may be formed so as to connect only to the uneven oxide film 256 formed in the rear end region 250f.

Figure 16:
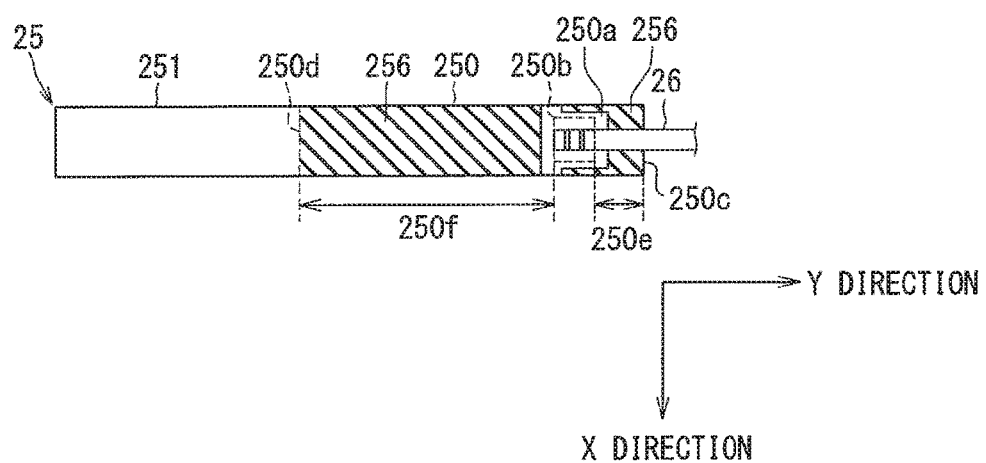
FIG. 16 is a plan view of a signal terminal as a second modification.

Further, in the second modification shown in FIG. 16, the uneven oxide films 256 are formed at positions on both sides of the connection region 250b in the X direction. The uneven oxide films 256 formed on the both sides of the connection region 250b connect only to the uneven oxide film 256 formed in the front end region 250e. Although not shown, the uneven oxide films 256 may be formed so as to connect only to the uneven oxide film 256 formed in the rear end region 250f.

The uneven oxide film 256 may be formed at least in the front end region 250e on the bonding surface 250a. For example, the uneven oxide film 256 may be formed in a portion of the front end region 250e distant from the front end 250c.

The invention claimed is:

1. An electronic device comprising:
an electronic component;
an encapsulating resin body that encapsulates the electronic component;
a lead frame that includes an inner lead disposed inside the encapsulating resin body, and an outer lead connecting to the inner lead and protruding to an outside of the encapsulating resin body, the lead frame being extended over an inside and outside of the encapsulating resin body; and
a bonding wire that electrically connects the electronic component and the inner lead inside the encapsulating resin body,
wherein:
the inner lead includes a base member formed using a metal material, and a film disposed at least on a surface of the base member, the surface being adjacent to a bonding surface to which the bonding wire is connected;
the film includes a metal thin film that is disposed on the surface of the base member and has a connection region, at a part, to which the bonding wire is connected, and an oxide film that is made of an oxide of the same metal as a metal being a main component metal of the metal thin film, and is disposed in at least a part of a region of the metal thin film, excluding the connection region to which the bonding wire is connected;
the oxide film includes an uneven oxide film having a surface with continuous asperities;
in the bonding surface, an end opposite to an end adjacent to the outer lead is referred to as a front end; and
the uneven oxide film is disposed in at least a part of a front end region that is a region of the bonding surface closer to the front end than the connection region.

2. The electronic device according to claim 1, wherein the uneven oxide film is disposed in a portion of the front end region of the bonding surface, the portion including the front end.

3. The electronic device according to claim 1, wherein:
the end of the bonding surface adjacent to the outer lead is referred to as a rear end; and
the uneven oxide film is further disposed in at least a part of a rear end region of the bonding surface, the rear end region being a region of the bonding surface closer to the rear end than the connection region.

4. The electronic device according to claim 3, wherein:
the uneven oxide film is further disposed at a position next to the connection region in a width direction orthogonal to an extension direction of the lead frame; and
the uneven oxide film disposed in the front end region, the uneven oxide film disposed next to the connection region, and the uneven oxide film disposed in the rear end region are integrally connected to each other.

5. The electronic device according to claim 4, wherein the uneven oxide films surrounds the connection region.

6. The electronic device according to claim 1, wherein the metal thin film has a plurality of recessed portions on a surface of a portion on which the uneven oxide film is disposed.

7. The electronic device according to claim 1, wherein an average thickness of a portion of the metal thin film on which the uneven oxide film is disposed is smaller than an average thickness of a portion of the metal thin film on which the uneven oxide film is not disposed.

8. The electronic device according to claim 1, wherein the oxide film includes an intermediate oxide film that is disposed adjacent to the uneven oxide film between the uneven oxide film and the connection region, and has a thickness larger than a thickness of a natural oxide film and is smaller than an average thickness of the uneven oxide film.

9. The electronic device according to claim 1, wherein the metal thin film contains Ni as a main component.

10. The electronic device according to claim 9, wherein the metal thin film is a plating film.

11. The electronic device according to claim 10, wherein the metal thin film is an electroless plating film.

12. A method for manufacturing an electronic device, the electronic device including
an electronic component,
an encapsulating resin body that encapsulates the electronic component,
a lead frame that includes an inner lead disposed inside the encapsulating resin body, and an outer lead connecting to the inner lead and protruding to an outside of the encapsulating resin body, the lead frame being extended over an inside and outside of the encapsulating resin body, and
a bonding wire that electrically connects the electronic component and the inner lead inside the encapsulating resin body,
the inner lead including a base member formed using a metal material, and a film disposed at least on a surface of the base member, the surface being adjacent to a bonding surface to which the bonding wire is connected,
the film including a metal thin film that is disposed on the surface of the base member and has a connection region, at a part, to which the bonding wire is connected, and an oxide film that is made of an oxide of the same metal as a metal being a main component metal of the metal thin film, and is disposed in at least a part of a portion on the metal thin film, excluding the connection region to which the bonding wire is connected, and
the oxide film including an uneven oxide film having a surface with continuous asperities,
the method for manufacturing the electronic device, comprising:
preparing the base member on which the metal thin film is disposed;
forming the uneven oxide film by irradiating at least a part of a front end region with pulsed laser light, the front end region being a region of the bonding surface that is closer to a front end than the connection region, the front end being opposite to an end of the bonding surface adjacent to the outer lead;

connecting the electronic component and the inner lead via the bonding wire after the forming of the uneven oxide film; and molding the encapsulating resin body so as to cover the bonding wire, the electronic component, and the inner lead.

* * * * *